(12) United States Patent
Ghoshal

(10) Patent No.: US 10,032,975 B2
(45) Date of Patent: Jul. 24, 2018

(54) THERMOELECTRIC DEVICES AND POWER SYSTEMS

(71) Applicant: Sheetak Inc., Austin, TX (US)

(72) Inventor: Uttam Ghoshal, Austin, TX (US)

(73) Assignee: Sheetak Inc., Austin, TX (US)

(\*) Notice: Subject to any disclaimer, the term of this patent is extended or adjusted under 35 U.S.C. 154(b) by 0 days.

(21) Appl. No.: 15/196,394

(22) Filed: Jun. 29, 2016

(65) Prior Publication Data

US 2016/0380174 A1 Dec. 29, 2016

Related U.S. Application Data

(60) Provisional application No. 62/186,082, filed on Jun. 29, 2015, provisional application No. 62/187,661, filed on Jul. 1, 2015.

(51) Int. Cl.
*H01L 35/32* (2006.01)
*H01L 35/10* (2006.01)
*H01L 35/08* (2006.01)

(52) U.S. Cl.
CPC ............ *H01L 35/325* (2013.01); *H01L 35/08* (2013.01); *H01L 35/10* (2013.01)

(58) Field of Classification Search
CPC ........ H01L 35/325; H01L 35/10; H01L 35/08
USPC .................................................. 136/200–242
See application file for complete search history.

(56) References Cited

U.S. PATENT DOCUMENTS

| | | |
|---|---|---|
| 5,650,904 A | 7/1997 | Gilley et al. |
| 6,300,150 B1 | 10/2001 | Venkatasubramanian |
| 2006/0124165 A1* | 6/2006 | Bierschenk ............. H01L 35/30 136/212 |
| 2011/0094556 A1 | 4/2011 | Stark |
| 2013/0239591 A1 | 9/2013 | Clarkson |

OTHER PUBLICATIONS

Berkowitz, B. et al., "Percolation Theory and Network Modeling Applications in Soil Physics", Surveys in Geophysics, V. 19: pp. 23-72, Kluwer Academic Publishers, Netherlands, 1998.
International Search Report and Written Opinion in PCT/US2016/040089 dated Sep. 23, 2016.

\* cited by examiner

*Primary Examiner* — Magali P Slawski
*Assistant Examiner* — Kourtney R S Carlson
(74) *Attorney, Agent, or Firm* — Bookoff McAndrews, PLLC

(57) ABSTRACT

A thermoelectric device may include first and second insulating substrates. An array of electrically conductive first metallizations may be positioned on one side of the first substrate, and an array of electrically conductive second metallizations may be positioned on a mating side of the second substrate. A plurality of thermoelectric elements may be positioned between the first and second substrates and interconnected together through the first and second metallizations in one of a square shaped network pattern or a delta shaped network pattern.

19 Claims, 9 Drawing Sheets

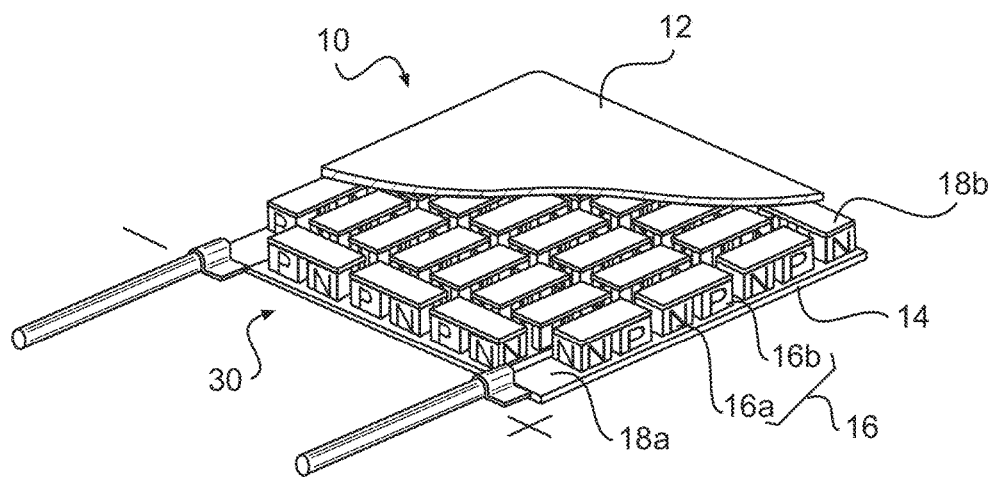
*FIG. 3A*
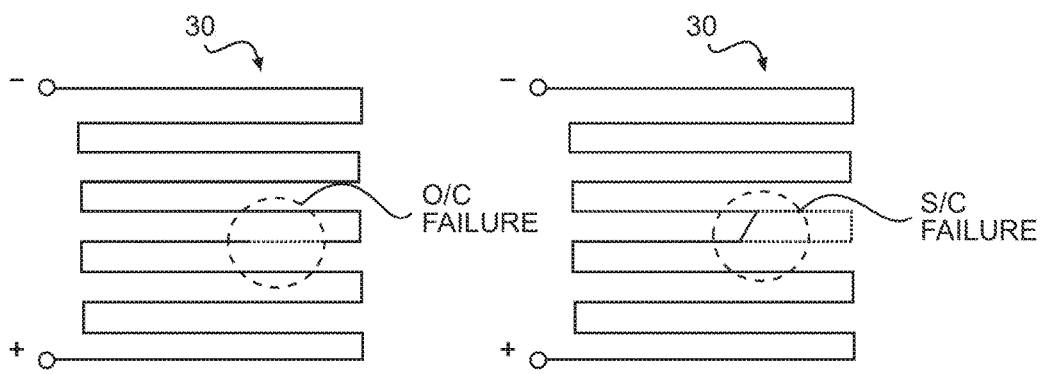
*FIG. 3B*  *FIG. 3C*

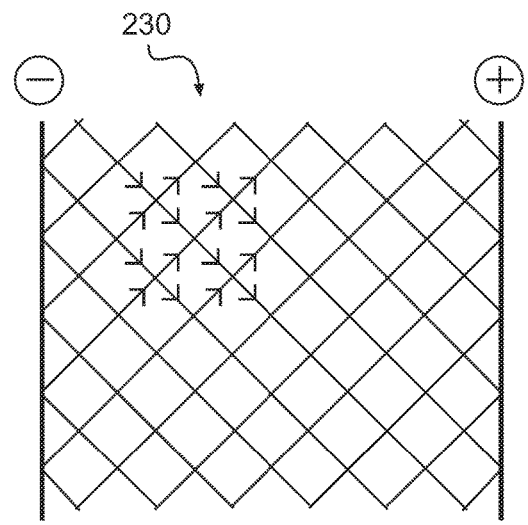
FIG. 5B
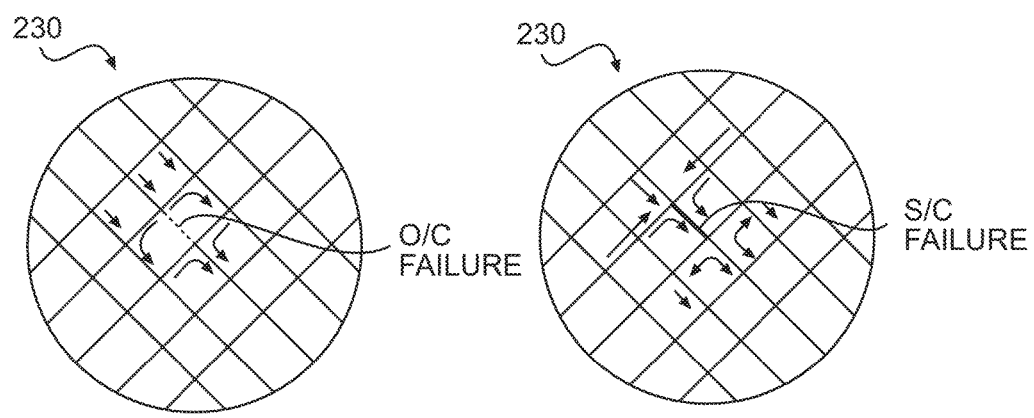
FIG. 5C  FIG. 5D

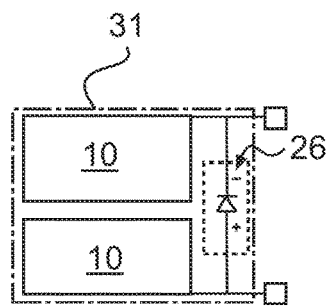
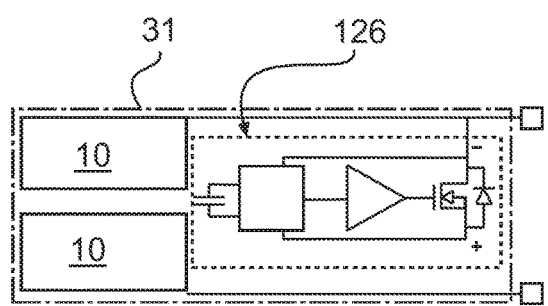
FIG. 9A  FIG. 9B
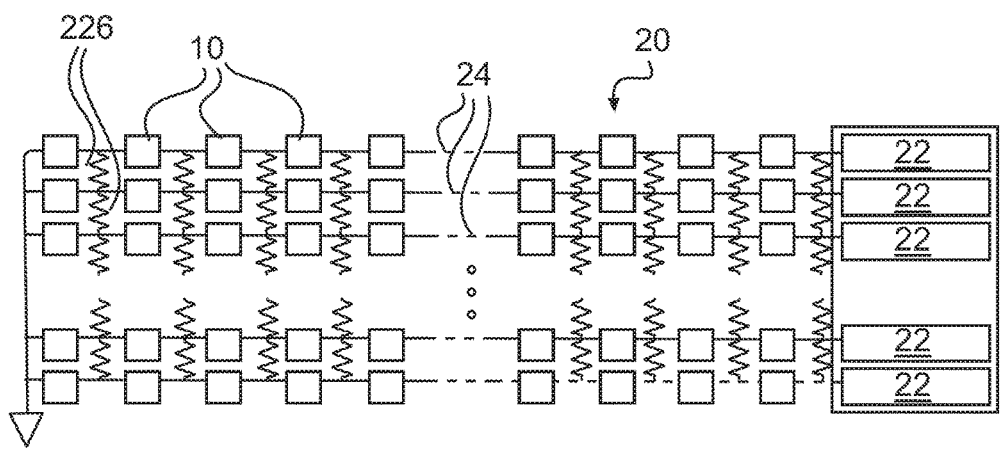
FIG. 10A

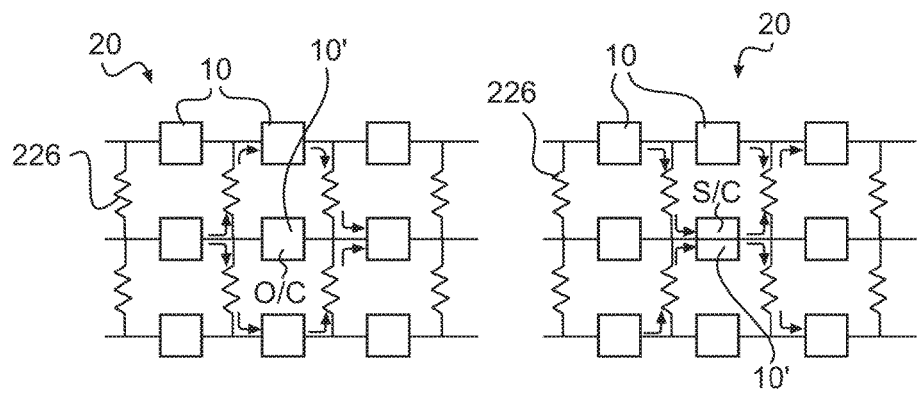
FIG. 10B  FIG. 10C
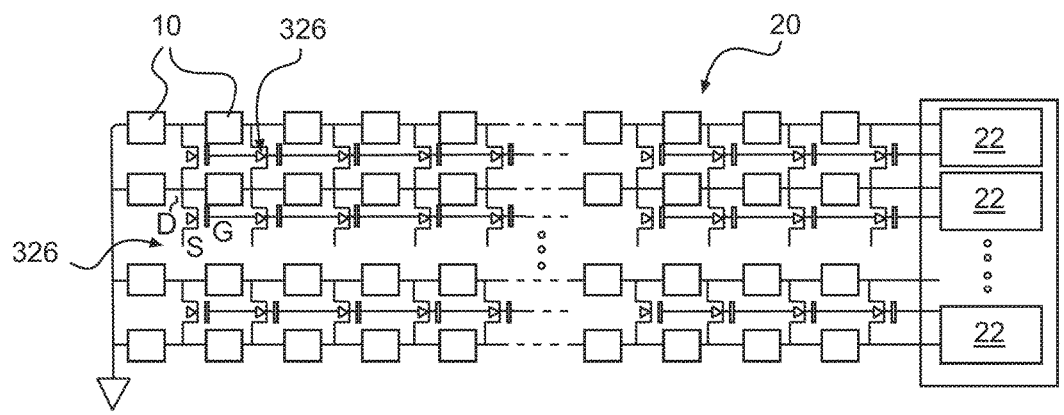
FIG. 11

THERMOELECTRIC DEVICES AND POWER SYSTEMS

CROSS-REFERENCE TO RELATED APPLICATIONS

The application claims the benefits of priority from U.S. Provisional Application No. 62/186,082, filed on Jun. 29, 2015, and U.S. Provisional Application No. 62/187,661, filed on Jul. 1, 2015, both of which are incorporated by reference herein in their entirety.

TECHNICAL FIELD

The present invention relates to thermoelectric devices and thermoelectric power systems which include multiple thermoelectric devices interconnected together.

BACKGROUND

Thermoelectric devices (TEDs) are solid-state devices that produce electrical energy when subjected to a temperature gradient, and produce a temperature gradient when subjected to an electric current. The conversion of a temperature gradient into electrical energy is due to the Seebeck effect, and the conversion of electrical energy into a temperature gradient is due to an inverse reciprocal effect known as the Peltier effect. TEDs include both thermoelectric cooling devices (TECs) and thermoelectric generators (TEGs). A TEC (also known as a Peltier device) is a thermoelectric device that transfers heat from one location to another when an electric current is passed through the device, and a TEG is thermoelectric device that generates an electric current when a temperature gradient is applied across the device.

A TED includes one or more pairs of thermoelectric elements (thermoelements) arranged between two substrates having a metallization pattern that electrically interconnects the thermoelements. When operating as a TEG, a temperature difference applied between the two substrates may be used to produce electric current. In some applications, a power system may be comprised of multiple TEGs interconnected together to power a load. A failure in one or more of the TEGs, or the interconnections between them, may negatively affect the electrical power supplied to the load. In order to provide uninterrupted power to the load, it is desirable that the thermoelectric device and the thermoelectric power system be fault tolerant. Embodiments of the current disclosure disclose fault-tolerant thermoelectric devices and thermoelectric power systems. The scope of the current disclosure, however, is defined by the attached claims, and not by the ability to solve any specific problem.

SUMMARY

In one aspect, a thermoelectric device is disclosed. The thermoelectric device may include a pair of electrically insulating substrates including a first substrate and a second substrate. The first and the second substrates may be positioned such that a first side of the first substrate faces a second side of the second substrate. An array of electrically conductive first metallizations may be spaced apart from each other and positioned on the first side of the first substrate, and an array of electrically conductive second metallizations may be spaced apart from each other and positioned on the second side of the second substrate. A plurality of thermoelectric elements, including multiple n-type thermoelectric elements and multiple p-type thermoelectric elements, may be positioned between the first side of the first substrate and the second side of the second substrate such that a first metallization of the array of first metallizations is electrically connected to an adjacent first metallization of the array of first metallizations through (i) two or more n-type thermoelectric elements attached to the first metallization, (ii) two or more p-type thermoelectric elements attached to the adjacent first metallization, and (iii) one or more second metallizations of the array of second metallizations to which the two or more n-type thermoelectric elements and the two or more p-type thermoelectric elements are attached. In some embodiments, the first metallization may be electrically connected to the adjacent first metallization only through (i), (ii), and (iii) above.

In another aspect, a thermoelectric device is disclosed. The thermoelectric device may include a first insulating substrate having a first side, and a second insulating substrate having a second side. The first and the second substrates may be positioned such that the first side of the first substrate faces the second side of the second substrate. An array of electrically conductive first metallizations may be positioned on the first side of the first substrate, and an array of electrically conductive second metallizations may be positioned on the second side of the second substrate. The first substrate and the second substrate may be aligned such that each of at least four second metallizations includes a region that overlaps with a first metallization. A plurality of thermoelectric elements, including multiple n-type thermoelectric elements and multiple p-type thermoelectric elements, may be positioned between the first side of the first substrate and the second side of the second substrate. A separate thermoelectric element of the plurality of thermoelectric elements may be attached between the first metallization and each of the at least four second metallizations. In some embodiments, these thermoelectric elements may be attached at an overlap region of the metallizations.

In another aspect, a thermoelectric device is disclosed. The thermoelectric device may include a first insulating substrate having a first side, and a second insulating substrate having a second side. The first and the second substrates may be positioned such that the first side of the first substrate faces the second side of the second substrate. An array of electrically conductive first metallizations may be positioned on the first side of the first substrate, and an array of electrically conductive second metallizations may be positioned on the second side of the second substrate. A plurality of thermoelectric elements, including multiple n-type thermoelectric elements and multiple p-type thermoelectric elements, may be arranged between the first side of the first substrate and the second side of the second substrate such that the plurality of thermoelectric elements are interconnected together through the array of first metallizations and the array of second metallizations in one of a square shaped network pattern or a delta shaped network pattern.

BRIEF DESCRIPTION OF THE DRAWINGS

The novel features of embodiments of the disclosure are set forth with particularity in the appended claims. A better understanding of the disclosure will be obtained by reference to the following detailed description that sets forth illustrative embodiments, in which the principles of the disclosure are utilized, and the accompanying drawings of which:

FIG. 3A illustrates an exemplary thermoelectric device with a portion of its internal circuitry exposed;

FIG. 3B is a schematic of the internal circuit of the thermoelectric device of FIG. 3A with an open-circuit fault;

FIG. 3C is a schematic of the internal circuit of the thermoelectric device of FIG. 3A with a short-circuit fault;

FIGS. 5A-5D are schematic illustrations of an exemplary internal circuit that provides multiple electrical pathways to bypass a failed thermoelement;

FIGS. 9A and 9B are schematic illustrations of an exemplary thermoelectric device of the thermoelectric power system of FIG. 8;

FIGS. 10A-10C illustrate another exemplary thermoelectric power system; and

FIGS. 11-13 illustrate other exemplary thermoelectric power systems.

DETAILED DESCRIPTION

While various embodiments of the invention have been shown and described herein, it will be obvious to those skilled in the art that such embodiments are provided by way of example only. Numerous variations, changes, and substitutions may occur to those skilled in the art without departing from the invention.

Thermoelectric Device

Figure 1:
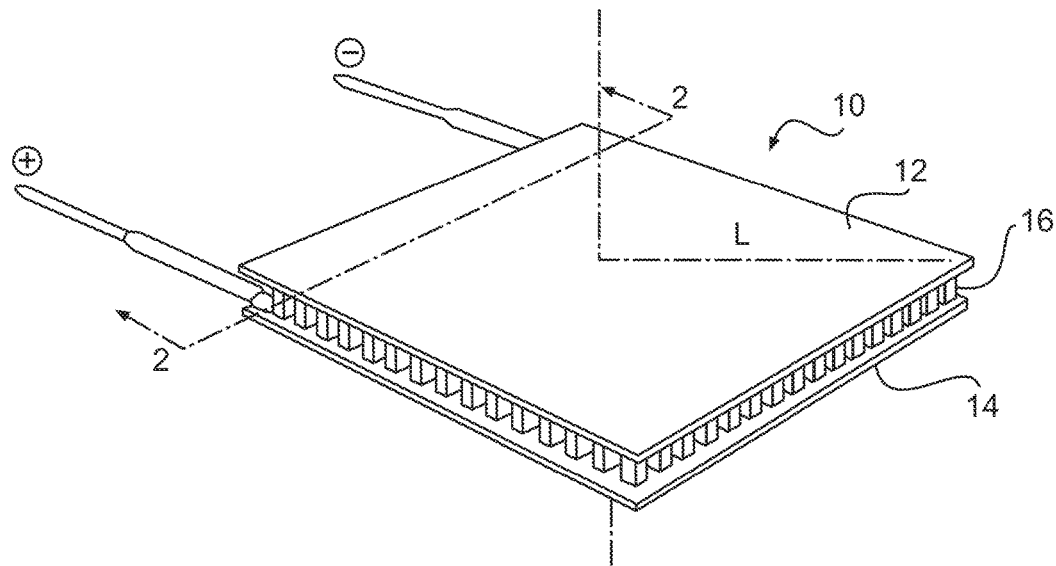
FIG. 1 illustrates an exemplary thermoelectric device.
Figure 2:
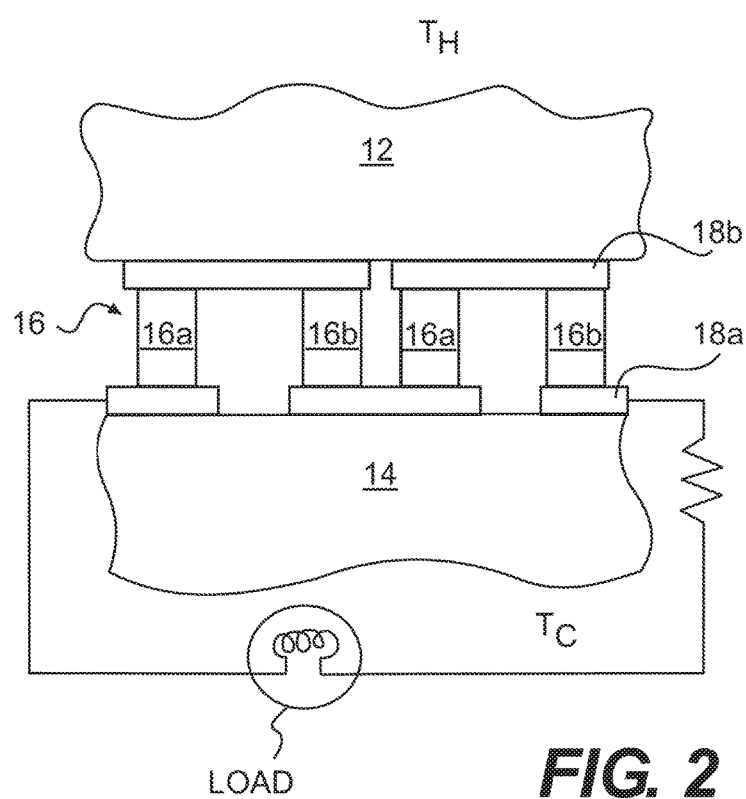
FIG. 2 is a cross-sectional view of the thermoelectric device of FIG. 1.

FIG. 1 illustrates a TED that may be used as a TEC or a TEG. Although the current disclosure can be applied to both TECs and TEGs, for the sake of brevity, only the application of the TED as a power generator (or TEG 10) is described below. FIG. 2 illustrates a cross-sectional view of TEG 10 through plane 2-2 of FIG. 1. In the description that follows, reference will be made to both FIGS. 1 and 2. TEG 10 includes one or more pairs of electrically connected thermoelements 16 connected thermally in parallel between two substrates (top substrate 12 and bottom substrate 14). Each pair of thermoelements 16 includes an n-type thermoelement 16a and a p-type thermoelement 16b. As is known in the art, an n-type thermoelement is made of a material that has excess electrons, and a p-type thermoelement 16b is made of a material that has excess holes. Any known thermoelectric material (silicon germanium, skutteride, etc.) may be used as n-type and p-type thermoelements 16a, 16b. Any number of thermoelement 16 pairs may be used in TEG 10. The bottom and top substrates 14 and 12 have patterned metallizations (bottom-substrate metallization 18a and top-substrate metallization 18b, respectively) that interconnect the thermoelements 16 of the TEG 10 in an internal circuit. The bottom-substrate and top-substrate metallizations 18a and 18b are formed as discrete islands which are unconnected with each other on the plane of their respective substrate. That is, the bottom-substrate metallizations 18a are not electrically coupled to each other through the substrate 14, and the top-substrate metallizations 18b are not electrically coupled to each other through the substrate 12. After attachment of the thermoelements 16, the bottom-substrate metallizations 18a (and the top-substrate metallizations 18b) are connected together only through the thermoelements 16. When one side of a substrate (e.g., top substrate 12) is exposed to a hot temperature ($T_H$) and one side of the other substrate (e.g., bottom substrate 14) is exposed to a rela-tively colder temperature ($T_C$), or vice versa, an electric current is generated through the circuit that interconnects the thermoelements 16. This current may be used to power an electrical load. A few exemplary TEGs 10 are described in more detail in U.S. patent application Ser. No. 14/742,364, filed on Jul. 17, 2015, and U.S. patent application Ser. No. 14/704,569, filed on May 5, 2015, both of which are incorporated herein by reference in its entirety.

As explained previously, TEG 10 converts a temperature differential ($\Delta T=T_H-T_C$) applied across the thermoelements 16 to a voltage/current output. However, exposure to high temperatures may cause some thermoelements 16 (or thermoelement pairs 16a, 16b) and other components of the TEG 10 to fail. These failures may be exacerbated when the TEG 10 is used at very high temperature (e.g., ≥900° C.) environments. Typically, these failures may be classified as open-circuit (o/c) failures or short-circuit (s/c) failures. Open-circuit failures (e.g., cracking due to coefficient of thermal expansion (CTE) mismatch or mechanical overstressing, etc.) of a TEG 10 may increase the resistance to current flow across the TEG 10, and in some cases, result in no current flow across the affected thermoelements 16. Short-circuit failures (shorting resulting from melted solder joints, breakdown of dielectrics, fluid leaks, etc.) may short the current across the affected thermoelements 16 and decrease the resistance to current flow and voltage across these thermoelements 16. Both the o/c fault and s/c fault decrease the net power generated across the load.

Figure 4:
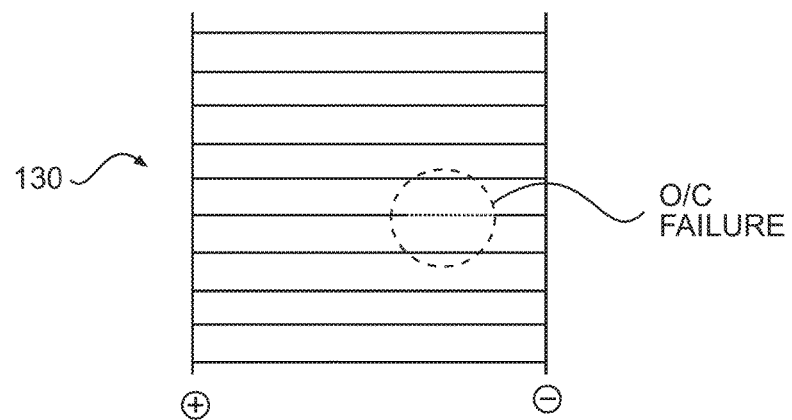
FIG. 4 is a schematic illustration of another exemplary internal circuit with an open-circuit fault.

FIG. 3A illustrates a view of an exemplary TEG 10 with a portion to the top substrate 12 removed to show the internal circuit 30 which interconnects the thermoelements 16 together. As illustrated in FIG. 3A, in some embodiments of TEG 10, the internal circuit 30 that interconnects the thermoelements 16 may daisy chain (or connect in series) all the thermoelements 16 together. FIGS. 3B and 3C illustrate a schematic of the internal circuit 30 of TEG 10 of FIG. 3A. FIG. 3B illustrates a case where one or more thermoelements 16 in the circuit 30 have failed due to o/c failure, and FIG. 3C illustrates a case where there is a s/c failure in multiple thermoelements 16 (i.e., multiple thermoelements 16 have shorted together). As illustrated in FIG. 3B, an o/c failure of one or more thermoelements 16 (or thermoelement pairs 16a, 16b) in the daisy chained internal circuit 30 may increase the resistance to current flow across the failed thermoelements, and reduce the power delivered to the load. Of course, in case of a complete o/c failure, no power will be delivered to the load. And, as illustrated in FIG. 3C, a s/c failure will decrease the resistance to current flow across the shorted thermoelements and decrease the voltage and power generated across the load To decrease the impact of such failures on the efficiency (or power generated for a fixed $\Delta T$) of a TEG 10, in some embodiments, the thermoelements 16 of a TEG 10 may be interconnected such that the impact of an o/c and/or a s/c failure of the thermoelements is minimized. FIG. 4 illustrates the schematic of the internal circuit 130 of another embodiment of a TEG 10. In the embodiment of FIG. 4, the internal circuit 130 of the TEG 10 is such that each row of thermoelements 16 is connected in series, with multiple series-connected rows connected in parallel to each other. In such an embodiment, an o/c failure of the thermoelements 16 in a row will only disrupt the current flow in that row. The rows without such a failure will continue to pass current. However, if there are o/c failures in every row, the net power generated will be nulled.

Figure 5A:
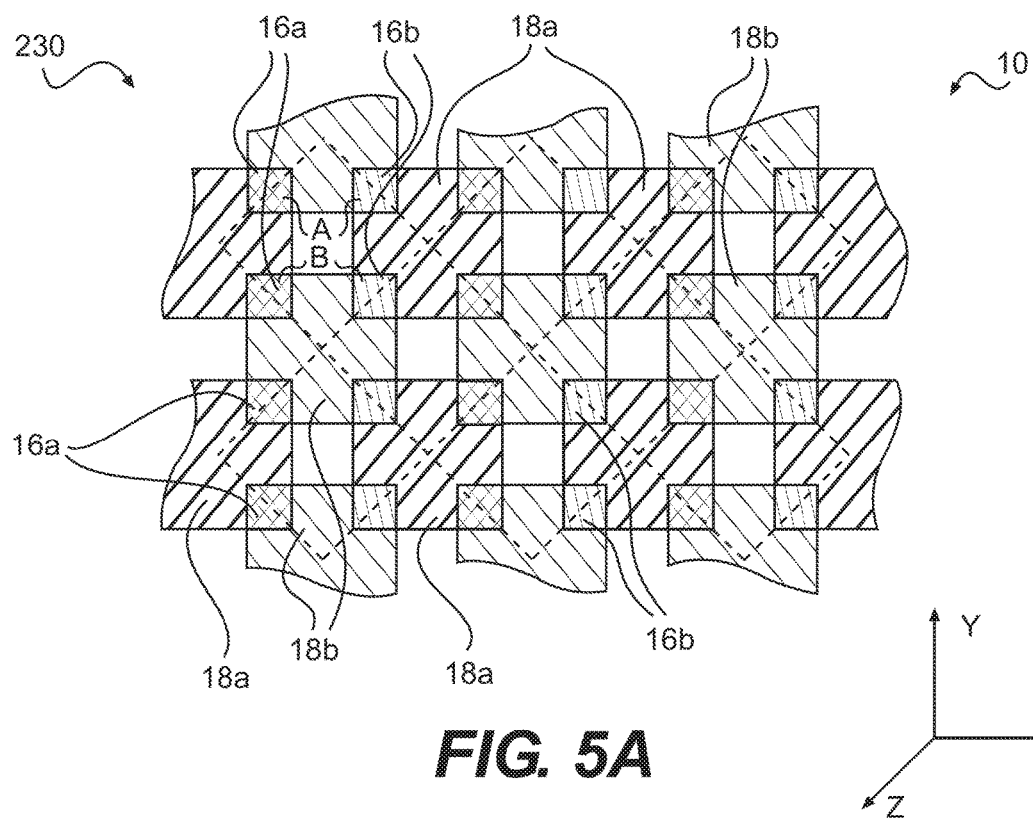

In some embodiments, the thermoelements 16 in a TEG 10 will be interconnected such that the internal circuit of the TEG 10 provides a detour for a failed thermoelement 16. FIGS. 5A-5D illustrates an exemplary embodiment of a TEG 10 with an internal circuit 230 that provides multiple electrical pathways to bypass a failed thermoelement 16. FIG. 5A illustrates a plan view (i.e., view along the z-axis) of the TEG 10 with its top and bottom substrates 12, 14 removed for clarity. FIG. 5A illustrates the thermoelements 16 (n-type and p-type thermoelements 16a and 16b) connected between the bottom-substrate and top-substrate metallizations 18a and 18b. The array of bottom-substrate metallizations 18a are spaced apart (e.g., in both x and y directions in the plane of the substrate) from the top-substrate metallizations 18b such that, when viewed along the z direction, each top-substrate metallization 18b is positioned between two adjacent bottom-substrate metallizations 18a (along each of the x and the y axis), with a region of overlap between the top-substrate metallization 18b and the two adjacent bottom-substrate metallizations 18a (in each of the x and the y axis directions).

As illustrated in FIG. 5A, four thermoelements 16 (two n-type and two p-type thermoelements 16a, 16b) are connected at the overlapping regions of each square shaped metallization 18a, 18b. Although a square shaped metallization is illustrated in FIG. 5A, in general, the metallizations 18a, 18b may have any shape (e.g., a polygonal shape such as, for example, rectangular, diamond, pentagonal, hexagonal, triangular, etc. or a shape with curves, such as, circular, oval, etc.). Further, although FIG. 5A illustrates the four thermoelements 16 on each metallization 18a, 18b as being attached to the corners of the metallizations 18a, 18b, this is not a requirement. In general, the thermoelements 16 may be attached to any region of metallizations 18a, 18b that overlap each other. It is also contemplated that, in some embodiments, the metallizations 18a, 18b may not overlap. Instead, the thermoelements 16 may be bend (curved, angled, etc.) to attach to the metallizations 18a, 18b.

In some embodiments, the four thermoelements may be arranged on each bottom-substrate metallization 18a such that two n-type thermoelements 16a are positioned on the right side and two p-type thermoelements 16b are positioned on the left side of the metallization 18a (in the orientation illustrated in FIG. 5A). The four thermoelements 16 are attached to each metallization 18a, 18b such that, in the x axis direction, two n-type thermoelements 16a attached to a bottom-substrate metallization 18a form a thermoelement pair with two p-type thermoelements 16b attached to its adjacent bottom-substrate metallization 18a through a top-substrate metallization 18b positioned between the two adjacent bottom substrate metallizations 18a. In other words, in the x direction, two n-type thermoelements 16a of a bottom-substrate metallization 18a are electrically connected to two p-type thermoelements 16b of an adjacent bottom-substrate metallization 18a through the top-substrate metallization 18b positioned between the adjacent bottom-substrate metallizations 18a. In this configuration, two adjacent metallizations 18a, 18b in the x direction are connected together by two thermoelectric pairs 16a, 16b (marked A and B in FIG. 5A). These two thermoelectric pairs 16a, 16b form two electrical pathways between every two adjacent bottom-substrate metallizations 18a (and adjacent top-substrate metallizations 18b) in the x direction.

The two thermoelectric pairs 16a, 16b formed between every two adjacent bottom-substrate metallizations 18a (and top-substrate metallizations 18b) of the TEG 10 create multiple electrical pathways that extend between the positive and negative terminals of the internal circuit 230. The dashed lines in FIG. 5A illustrate a portion of the electrical pathways in the internal circuit 230. That is, the pattern of the metallizations 18a and 18b, and the arrangement of the n-type and p-type thermoelements 16a, 16b on these metallizations, are such that electrical current flow from the negative terminal to the positive terminal of the TEG 10 (and current flows from the positive to the negative terminal) along any of the dashed lines of FIG. 5A.

FIG. 5B illustrates a schematic network representation of the internal circuit 230 of FIG. 5A. As illustrated in FIGS. 5A and 5B, the thermoelements 16 are interconnected in such a way that the internal circuit 230 forms a square or a diamond shaped network pattern (i.e., a 4-sided pattern), with a thermoelement positioned midway between the nodes (intersections or vertices) of the square pattern. In FIG. 5B, the nodes represent the center of the metallizations 18a, and the arrows represent the current flow from between the metallizations 18a, 18b as it flows from the negative terminal to the positive terminal upon application of a temperature differential between the top and bottom substrates 12, 14. As can be seen in FIG. 5B, current can flow out of (i.e., in the direction of the positive terminal) a metallization 18a, 18b through two electrical paths, and flow into (i.e. from the negative terminal) a metallization 18a, 18b through two electrical paths. Therefore, even if one path fails (i.e., the thermoelements 16 or other components in the path fails), current can flow between the metallizations 18a, 18b through the second path.

FIG. 5C illustrates a case where a thermoelement 16 in the internal circuit 230 experiences an o/c failure, and FIG. 5D illustrates a case where a thermoelement 16 experiences a s/c failure. As illustrated by the arrows in FIG. 5C, when a thermoelement experiences an o/c failure, the multiple electrical pathways of the internal circuit 230 provide a detour for the current flow from the negative to the positive terminal (and the electrons flowing in the opposite direction). Although the loss of an electrical pathway (as a result of the o/c failure in a thermoelement) does increase the resistance to current flow across the internal circuit 230, the availability of multiple electrical pathways reduces the magnitude of this resistance increase, and its overall impact to current flow in the TEG 10. Similarly, as illustrated by the arrows in FIG. 5D, when a thermoelement experiences a s/c failure, electrical current flow in the vicinity of the failure preferentially occurs through the shorted joint (due to its decreased resistance). However, the presence of multiple electrical pathways make the impact of this decreased resistance localized, and reduces its impact to overall efficiency of the TEG 10. Thus, when the internal circuit of a TEG has multiple electrical pathways between adjacent metallizations (or thermoelements), the effect of a thermoelement failure (both an o/c and a s/c failure) on the efficiency of the TEG is significantly lower than when only a single pathway exists between the metallizations (e.g., in a conventional daisy chained TEG).

One of the advantages of a judicious network design arises when multiple thermoelements in an internal circuit of a TEG fails. For instance, if each of the rows in the internal circuit 130 depicted in FIG. 4 (with a total of M thermoelements 16 arranged in N rows) has an occurrence of an o/c fault, the power generated by the TEG would be reduced to zero. Since the number of rows, N, is typically significantly smaller than M, the probability of failure is high. In contrast, based on Percolation theory, a TEG 10 comprising the diamond or square internal circuit 230 depicted in FIG. 5B, with a total of M branches, will fail only when the number of o/c or s/c faults, N, is greater than $((1-p_c) \times M)$, where $p_c$ is the critical percolation probability. See "Percolation Theory and Network Modeling Applications in Soil Physics," Brian Berkowitz et al., Surveys in Geophysics, V. 19: pp.23-72, 1998. Based on Percolation theory, $p_c$=0.5 for the square internal circuit. Hence, the power generated by a TEG 10 with an internal circuit 230 having a square shaped network pattern will be zero only if half of the total number of thermoelements 16 in the network fails. Since the probability of failure of half of the thermoelements is small, the square shaped network pattern is fault-tolerant.

Figure 6A:
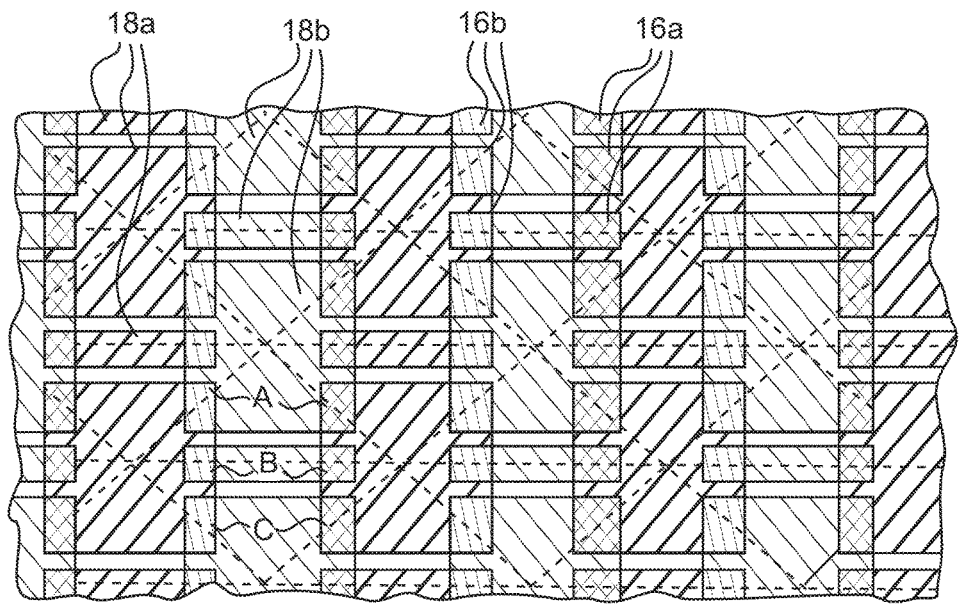
FIGS. 6A-6D are schematic illustrations of an exemplary internal circuit that provides multiple electrical pathways to bypass a failed thermoelement.

In internal circuit 230 of FIG. 5A, two electrical pathways exist between two adjacent metallizations 18a (and metallizations 18b) of the TEG 10. The effect of a thermoelement failure on TEG efficiency can be further reduced by increasing the number of electrical pathways between adjacent metallizations. FIGS. 6A-6D illustrate another exemplary embodiment of a TEG 10 with an internal circuit 330 that provides three electrical pathways between adjacent metallizations 18a to bypass a failed thermoelement 16. In FIG. 6A, as in the case with FIG. 5A, the top and bottom substrates 12, 14 have been removed to show the internal circuit 330 of the TEG. For the sake of brevity, features of FIG. 6A that are common to FIG. 5A, or are evident from the figures, are not described. In internal circuit 330, two adjacent bottom-substrate metallizations 18a (and 18b) in the x direction are connected together by three thermoelement pairs 16a, 16b (marked A, B, and C in FIG. 6A). These three thermoelectric pairs 16a, 16b form three electrical pathways between every two adjacent bottom-substrate metallizations 18a (and adjacent top-substrate metallizations 18b) in the x direction.

Figure 6B:
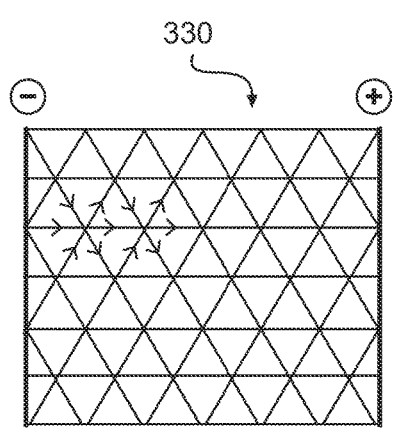
Figure 6C:
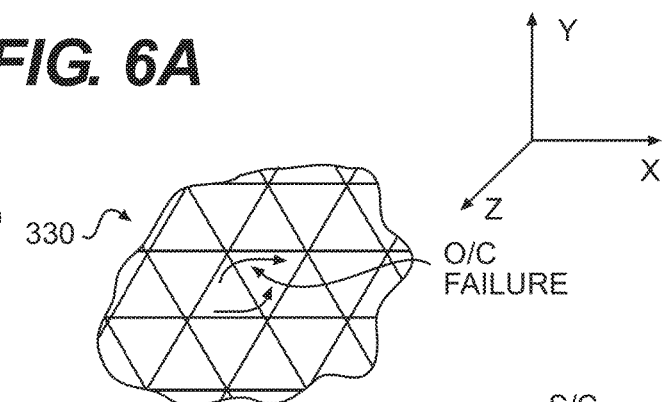
Figure 6D:
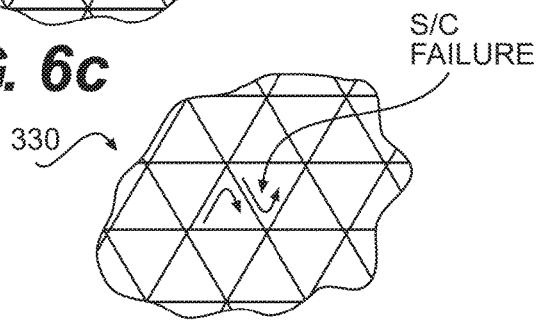

The three electrical pathways between adjacent bottom-substrate metallizations 18a are illustrated by dashed lines in FIG. 6A. FIG. 6B illustrates a schematic network representation of the internal circuit 330 of FIG. 6A with the arrows indicating the current flow between adjacent bottom-substrate metallizations 18a. As can be seen in FIGS. 6A and 6B, the pathways between the metallizations create a triangular or delta ($\Delta$) shaped network pattern, with three electrical pathways extending away from each metallization 18a and 18b, and three electrical pathways extending towards each metallization 18a and 18b. FIG. 6C illustrates a case where a thermoelement of the internal circuit 330 experiences an o/c failure, and FIG. 6D illustrates a case where a thermoelement experiences an s/c failure. As illustrated by the arrows in FIG. 6C, when a thermoelement experiences an o/c failure, the multiple electrical pathways provide a detour for the electrical current as it travels towards the positive terminal. Similarly, as illustrated by the arrows in FIG. 6D, when a s/c failure of a thermoelement 16 occurs, electrical current flow in the neighborhood of the failure preferentially occurs through the shorted joint. However, as discussed with reference to FIGS. 5C and 5D, the presence of multiple electrical pathways reduces the impact of the o/c and s/c failures on the overall current flow across the TEG (and hence its efficiency).

Based on Percolation theory, a TEG 10 comprising a triangular or delta internal circuit 330 depicted in FIG. 6B, with a total of M branches, will fail only when the number of o/c or s/c faults, N, is greater than (($1-p_c$)×M), where $p_c$ is the critical percolation probability. Percolation theory predicts that $p_c$=0.35 for a delta shaped network pattern. Hence, the power generated by a TEG with an internal circuit 330 having a delta shaped network pattern will be zero only if 65% of the total number of thermoelements fail. Since the probability of failure of 65% of the total number of thermoelements is small, a delta shaped internal circuit 330 is fault-tolerant.

The internal circuits 230 and 330 discussed above can be generalized to include more electrical pathways. In some embodiments, more than three (4, 5, 6, etc.) electrical pathways may be provided between adjacent bottom-substrate metallizations 18a and top-substrate metallizations 18b. Although all the internal circuits described above are two-dimensional, in some embodiments, the internal circuit may be three-dimensional. For, example, in some embodiments, a stacked TEG may include several layers of TEGs stacked together, and the metallizations of one layer may be connected to the metallizations of another layer, for example, to resemble a face centered cubic structure. In three-dimensional networks, Percolation theory indicates that the critical probability is small ($p_c$<0.1). Thus, internal circuits with a three dimensional network pattern will fail only if more than 90% of the thermoelements fail, which is a highly unlikely event. It should be noted that, although the internal circuits discussed above were described with reference to a TEG (thermoelectric generator), this is only exemplary. In general, the disclosed concepts are equally applicable to a thermoelectric cooler.

Thermoelectric Power System (TPS)

Figure 7:
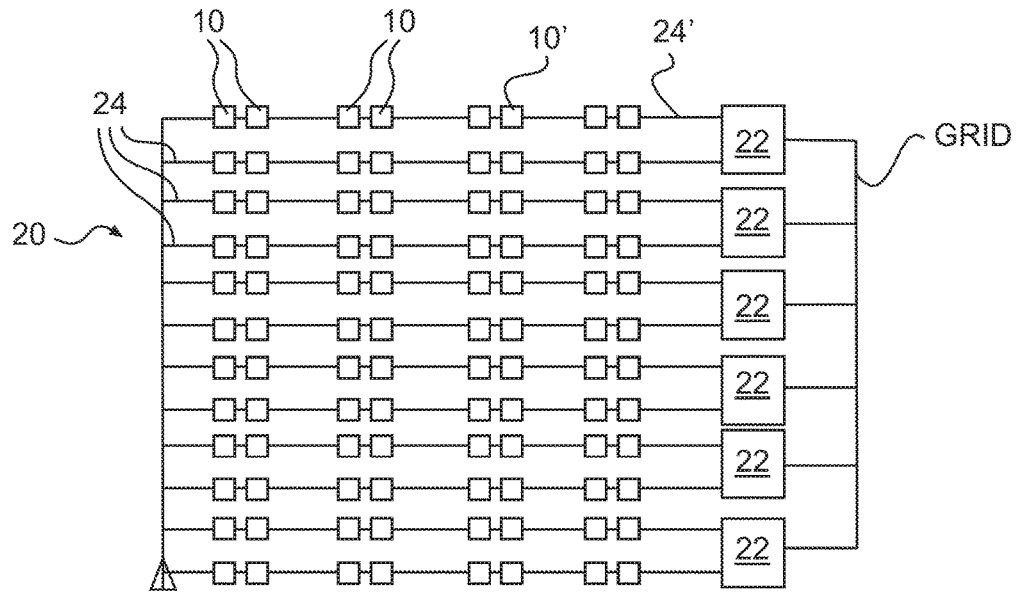
FIG. 7 illustrates an exemplary thermoelectric power system formed using a plurality of thermoelectric devices of FIG. 1.

While a single TEG 10 may be used to power a load in some applications, in typical generator applications, multiple TEGs 10 may be interconnected together to supply power to an electrical grid. FIG. 7 illustrates an exemplary embodiment in which a plurality of TEGs 10 are interconnected to form a thermoelectric power system (TPS 20) that supplies power to an electrical grid (e.g., at home or elsewhere). In the embodiment of FIG. 7, eight TEGs 10 are connected in series to form a chain 24 of series-connected TEGs 10, connected to a maximum power point tracking (MPPT 22) chip or a micro-inverter. The MPPT 22 converts the DC output of the TEGs 10 in a chain 24 to AC output for the grid. As is known to a person of ordinary skill in the art, the MPPT 22 may also filter the output to match the frequency and maximize the power transfer to the local grid supply, and optimize the match between the chain 24 and the grid, for example, by providing impedance matching between the chain of TEGs 10 and the grid. Any commercially available MPPT chip (e.g., from Enphase Energy, etc.) may be used as MPPT 22. In some embodiments, as illustrated in FIG. 7, multiple chains 24 of TEGs 10 may be connected to the grid via a single MPPT 22. However, in some embodiments, each chain 24 may be connected to the grid via a separate MPPT 22. In general, the TEGs 10 of TPS 20 may output any voltage. In some embodiments, each TEG 10 may output a voltage of about 5.5 volts (V) when a preselected temperature differential is applied across the TEG 10. In such a configuration, the voltage output of each chain 24 of TEGs 10 will be about 44 V. The MPPT 22 will then convert the DC to AC and filter the output to match the local grid current before providing the power to the grid. Each chain 24 of TEGs 10 in TPS 20 may operate in a similar manner to provide power to the grid.

As explained previously, the TEGs 10 convert a temperature differential ($\Delta T=T_H-T_C$, see FIG. 2) applied across the TEG 10 to a voltage/current output. As explained previously, exposure to high temperatures may cause some of the TEGs 10 to fail (e.g., due to o/c or s/c failures discussed previously). As a result of an o/c failure (e.g., cracking due to coefficient of thermal expansion (CTE) mismatch or mechanical overstressing, etc.), the resistance to current flow across the TEG 10 may increase, and in some cases, result in no current flow across the affected TEG. As a result of s/c failures (shorting resulting from melted solder joints, breakdown of dielectrics, fluid leaks, etc.), the resistance to current flow across the TEG 10 may decrease because of shorting. As a result of these failures, the power generated by the system is reduced. In the configuration of FIG. 7, an o/c or a s/c failure of a TEG 10 in a chain 24 will change the voltage output by that chain 24. For example, if the TEG marked 10' in chain 24' fails as a result of an o/c failure, the current produced by the five TEGs 10 upstream of TEG 10' will not flow to the MPPT 22 connected to chain 24'. In this case, the voltage output by chain 24' will be 0 V. On the other hand, if TEG 10' fails by s/c failure, the current produced by the five TEGs 10 upstream of TEG 10' will be shorted across the failed TEG 10', resulting in a voltage of about 38.5 V from chain 24'. The MPPT 22 connected to chain 24' will then convert this DC voltage to AC and change its internal load to impedance match chain 24' with the grid impedance. Thus, in the configuration of TPS 20 of FIG. 7, an o/c failure of TEGs 10 in one or more chains 24 may significantly reduce the power delivered by these chains 24 to the grid.

To minimize the effect of o/c failures of TEGs 10 on the power output of a TPS 20, in some embodiments, circuit elements may be provided to bypass the TEGs 10 of the TPS 20. The use of selected types of circuit elements (such as, for example, diodes, resistors, transistors, etc.) to minimize the effect of a failure of one or more TEGs 10 of a TPS 20 will be described with reference to several embodiments below. It should be noted that these circuit elements themselves, and their functioning, are well known in the art. Therefore, for the sake of brevity, known features of the these circuit elements will not be described herein.

Figure 8:
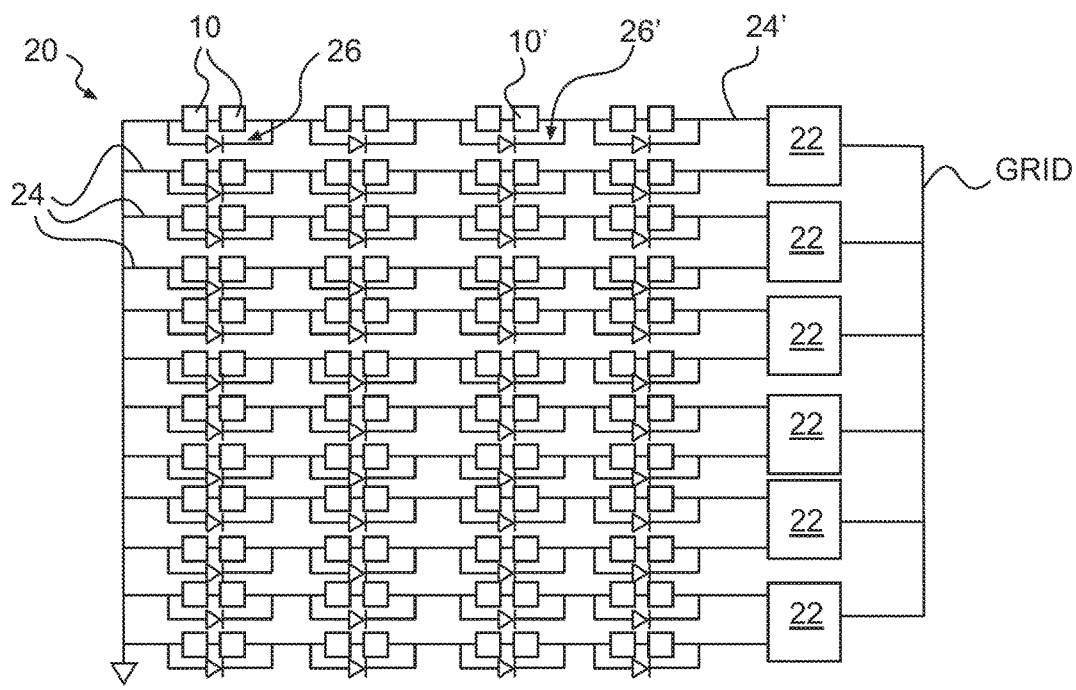
FIG. 8 illustrates another exemplary thermoelectric power system.

FIG. 8 illustrates an embodiment of a TPS 20 in which a circuit element in the form of a diode 26 is connected in parallel across each pair of TEGs 10 in the chains 24 of the TPS 20. When a TEG 10' fails by an o/c failure, the current produced by the TEGs 10 upstream of the failed TEG 10' is bypassed through diode 26'. In the embodiment illustrated in FIG. 8, the voltage output of a chain 24 will be about 33 V if one of the bypassed TEGs 10 fails by an o/c failure. Thus, the diodes 26 allow a string of series-connected TEGs 10 to continue supplying power to the grid at a reduced voltage rather than no power at all. Since the functioning of a diode is well known in the art, it is not discussed herein. The diodes 26 of FIG. 8 may bypass a pair of TEGs 10 that it is connected across when the voltage across the diode 26 reaches 11 V. However, this is only exemplary. In general, any type and number of diodes may be used. For example, in some embodiments, a separate diode 26 (e.g., a 5.5 V diode) may be used to bypass every TEG 10 of TPS 20, etc. Any type of diode 26 (e.g., bypass diode, Schottky diode, smart bypass diode, etc.) may be used in TPS 20. Irrespective of the type of diode used, these diodes 26 may be connected in parallel across one or more TEGs 10 of a chain 24 so that, even if some of the TEGs 10 fail by an o/c failure, the remaining TEGs 10 in the chain 24 will continue to provide power to the grid. Since the properties and relative benefits of different types of diodes are known in the art, this is not discussed herein.

In some embodiments, as illustrated in FIG. 8, a separate diode 26 may be physically connected across one or more TEGs 10 of the TPS 20. However, this is not a requirement. In some embodiments, as illustrated in FIGS. 9A and 9B, a diode may be incorporated with one or more TEGs 10 to form an individual semiconductor package. FIG. 9A illustrates a package 31 that includes a pair of TEGs 10 and a diode 26 connected in parallel across the TEGs 10. The diode 26 may be any commercially available chip (e.g., from National Semiconductors, Linear Technology, ST Microelectronics, etc.) that is attached to a common substrate as the pair of TEGs 10 to form a discrete package 31. FIG. 9B illustrates an embodiment where a package 31 is formed by attaching a smart bypass diode 126 in parallel across a pair of TEGs 10. Such packages 31 that include a diode 26, 126 arranged to bypass multiple TEGs 10 may then be series-connected to form a chain 24, and multiple chains 24 connected together in parallel to form a TPS 20.

FIG. 10A illustrates another embodiment of a TPS 20 in which multiple parallel connected chains 24 of TEGs 10 are connected together by resistors 226. One end of each chain 24 is connected to the electrical grid through an MPPT 22 and the opposite end is grounded. As explained previously, each chain 24 may be connected to a separate MPPT 22 as illustrated in FIG. 10A, or multiple chains 24 may be connected to the grid through a single MPPT 22 (as illustrated in FIGS. 7 and 8). As illustrated in FIG. 10A, in some embodiments, the resistors 226 may be positioned between every adjacent pair of TEGs 10 to bypass each TEG 10 in case of an o/c failure of the TEG 10. It is also contemplated that, in some embodiments, the resistors 226 may be positioned only between multiple TEGs (two, three, etc.) to bypass the multiple TEGs 10 in case of an o/c failure in any one of these multiple TEGs 10. Any commercially available resistor may be used as resistor 226.

FIGS. 10B and 10C illustrate a portion of the TPS 20 of FIG. 10A with a faulty TEG 10'. FIG. 10B illustrates the case where TEG 10' includes an o/c failure, and FIG. 10C illustrates the case where TEG 10' includes a s/c failure. In the case of an o/c failure, the resistance of the resistors 226 should be smaller than the resistance of the TEG ($R_{TEG}$) to allow current to detour around the faulty TEG 10' as illustrated in FIG. 10B. In case of a s/c failure, the resistance of the resistors 226 should be greater than $R_{TEG}$ to prevent the current from being drained into the faulty TEG 10' as illustrated in FIG. 10C. In general, the resistance value of the resistors 226 may be selected based on the primary fault mechanism of the TEGs in the system.

FIG. 11 illustrates another embodiment of a TPS 20 where multiple parallel connected chains 24 of TEGs 10 are interconnected by transistors 326. As explained with reference to the embodiment of FIG. 10A, although the transistors 326 are illustrated as being positioned between every adjacent pair of TEGs 10, other configurations are also possible. A MOSFET transistor is illustrated in FIG. 11. However, this is not a requirement. In general, any suitable transistor may be used in TPS 20. As would be recognized by a person of ordinary skill in the art, transistor 326 includes a gate, a drain, and a source (marked by the symbols "G", "D", and "S" in a transistor 326 of FIG. 11), where the gate is the control terminal and current selectively flows between the drain and the source based on the gate voltage. As would be further recognized by a person of ordinary skill in the art, in transistor 326, no current flows between the drain and the source when the voltage between the gate and the source ($V_{GS}$) is less than a threshold value ($V_{TH}$).

When a TEG 10 fails due to an o/c failure, the corresponding MPPT 22 (i.e., the MPPT which the faulty TEG is connected to) sees a low current. When the MPPT 22 detects a low current, it increases the gate voltage of the corresponding row. The increase in gate voltage causes $V_{GS}$ to be greater than or equal to $V_{TH}$, and results in current flow from the drain to the source. That is, in response to an open-circuit failure of a TEG 10, the corresponding MPPT 22 increases the gate voltage causing current to bypass the faulty TEG 10 and flow into the adjacent chain 24 through a transistor 326. When a TEG 10 fails due to a s/c failure, the corresponding MPPT 22 will detect a low voltage on chain 24. When the MPPT 22 detects a low voltage, it controls the gate voltage such that $V_{GS}<V_{TH}$, to prevent current flow from adjacent chains 24 draining into the faulty TEG 10. Thus, TPS 20 of FIG. 11 automatically adapts to the type of failure experienced by the TEGs 10.

The embodiments of TPS 20 discussed with reference to FIGS. 7-11 rely on the use of additional circuit elements to bypass (or detour around) a failure TEG 10. Although specific circuit elements are discussed above, the use of other types of circuit elements such as, for example, phase-change resistive elements and magnetic tunnel junctions are also contemplated. In some applications, the use of additional circuit elements to improve the fault resistance of a TPS 20 may increase the cost of the system and/or introduce complexities in integration/manufacture. Therefore, in some embodiments, the TPS 20 may be interconnected together in the same manner as the different thermoelements 16 are interconnected together in the embodiments of FIGS. 5A-5D and FIGS. 6A-6D. That is, the TEGs 10 may be interconnected together such that multiple electrical paths are provided between the TEGs 10 to detour around a failed TEG 10.

Figure 12:
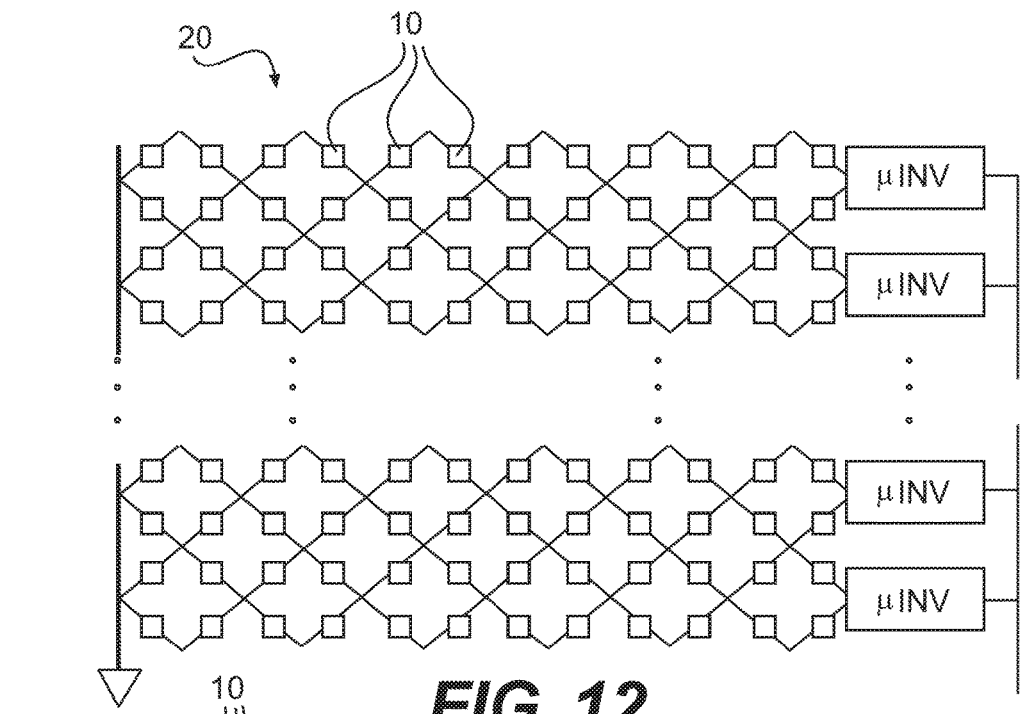

FIG. 12 is an embodiment of a TPS 20 that includes a plurality of TEGs 10 interconnected together in a square shaped circuit. Micro-inverters (or MPPTs 22) connect the interconnected TEGs to the grid. Similar to that discussed with reference to FIGS. 5A-5D, the TEGs 10 are positioned midway between the nodes (intersections or vertices) of the square pattern. The nodes represent points of interconnection between adjacent TEGs 10 and the arrows represent the current flow between these adjacent TEGs as it flows towards the micro-inverter. As can be seen in FIG. 12, current can flow into and out of an interconnection through two electrical paths. Therefore, even if one TEG 10 fails, current can continue to flow in the network by bypassing the failed TEG.

Figure 13:
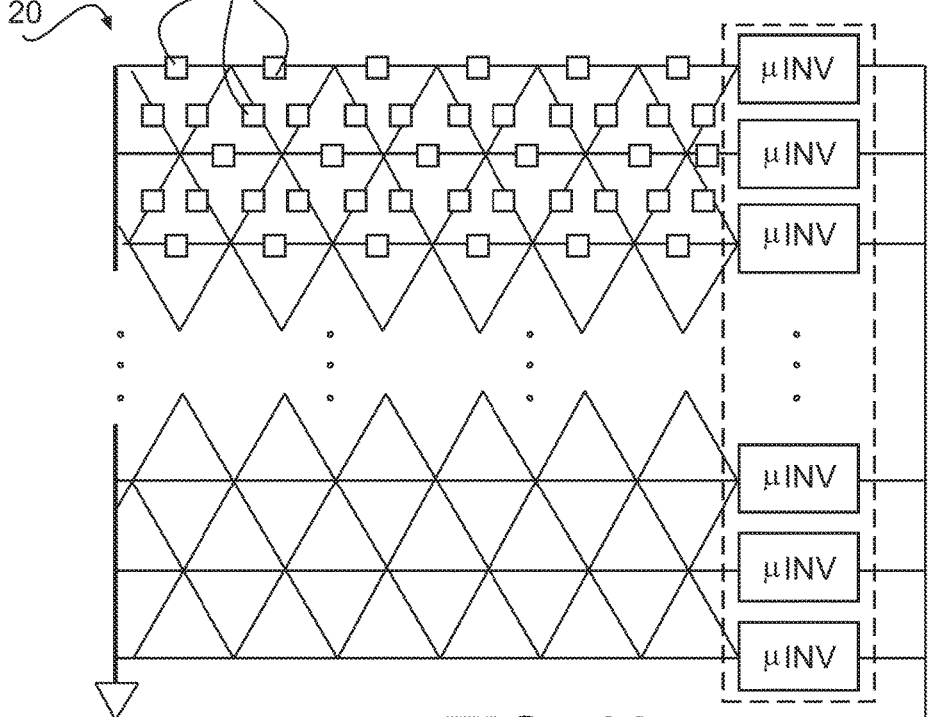

FIG. 13 discloses another embodiment of a TPS 20 that includes multiple TEGs 10 interconnected to form a triangle shaped ("delta") network. Micro-inverters (or MPPTs 22) connect the interconnected TEGs to the grid. In the embodiment of FIG. 13, as discussed with reference to FIGS. 6A-6D, current can flow into and out of an interconnection (between the TEGs 10) through three different electrical paths. And, the additional paths allow current to bypass a failed TEG. Providing multiple current pathways in the TEG network allows current to continue to flow into the grid by bypassing faulty TEGs. Thus, failure of one or more TEGs in the TPS 20 will not significantly affect the efficiency of the TPS 20.

It should be understood from the foregoing that, while particular implementations have been illustrated and described, various modifications can be made thereto and are contemplated herein. It is also not intended that the invention be limited by the specific examples provided within the specification. While the invention has been described with reference to the aforementioned specification, the descriptions and illustrations of the embodiments herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents.

I claim:

1. A thermoelectric device, comprising:
a pair of electrically insulating substrates including a first substrate and a second substrate, the first and the second substrates being positioned such that a first side of the first substrate faces a second side of the second substrate;
an array of electrically conductive first metallizations spaced apart from each other on the first side of the first substrate, and an array of electrically conductive second metallizations spaced apart from each other on the second side of the second substrate; and
a plurality of thermoelectric elements, including multiple n-type thermoelectric elements and multiple p-type thermoelectric elements, positioned between the first side of the first substrate and the second side of the second substrate such that a first metallization of the array of first metallizations is electrically connected to an adjacent first metallization of the array of first metallizations through (i) two or more n-type thermoelectric elements directly attached to the first metallization, (ii) two or more p-type thermoelectric elements directly attached to the adjacent first metallization, and (iii) one or more second metallizations of the array of second metallizations to which the two or more n-type thermoelectric elements and the two or more p-type thermoelectric elements are directly attached, wherein the first metallization and the adjacent first metallization are positioned next to each other in an electrical pathway that connects the array of first metallizations.

2. The thermoelectric device of claim 1, wherein the first metallization is electrically connected to the adjacent first metallization only through the two or more n-type thermoelectric elements attached to the first metallization, the two or more p-type thermoelectric elements attached to the adjacent first metallization, and the one or more second metallizations to which the two or more n-type thermoelectric elements and the two or more p-type thermoelectric elements are attached.

3. The thermoelectric device of claim 1, wherein the plurality of thermoelectric elements are interconnected together through the array of first metallizations and the array of second metallizations to form a square shaped network pattern.

4. The thermoelectric device of claim 1, wherein the plurality of thermoelectric elements are interconnected together through the array of first metallizations and the array of second metallizations to form a delta shaped network pattern.

5. The thermoelectric device of claim 1, wherein at least four second metallizations of the array of second metallizations form regions of overlap with the first metallization, wherein each of the two or more n-type thermoelectric elements and the two or more p-type thermoelectric elements are attached to the first metallization at a separate region of overlap.

6. The thermoelectric device of claim 1, wherein each of the first metallizations and the second metallizations have a quadrilateral shape.

7. The thermoelectric device of claim 1, wherein multiple thermoelectric elements that are arranged parallel to one edge of the first substrate are connected together to a common first terminal, and multiple thermoelectric elements that are arranged parallel to an opposite edge of the first substrate are connected together to a common second terminal.

8. The thermoelectric device of claim 1, wherein thermoelectric elements of the plurality of thermoelectric elements are arranged on each first metallization such that at least two thermoelectric element pairs are formed between each first metallization and an adjacent first metallization.

9. The thermoelectric device of claim 1, wherein thermoelectric elements of the plurality of thermoelectric elements are arranged on each first metallization such that at least two electrical pathways are formed between each first metallization and an adjacent first metallization.

10. A thermoelectric device, comprising:
a first insulating substrate having a first side, and a second insulating substrate having a second side, the first and the second substrates being positioned such that the first side of the first substrate faces the second side of the second substrate;
an array of electrically conductive first metallizations on the first side of the first substrate, and an array of electrically conductive second metallizations on the second side of the second substrate, wherein the first substrate and the second substrate are aligned such that each of at least four second metallizations includes a region that overlaps with a first metallization; and
a plurality of thermoelectric elements, including multiple n-type thermoelectric elements and multiple p-type thermoelectric elements, positioned between the first side of the first substrate and the second side of the second substrate, wherein a separate thermoelectric element of the plurality of thermoelectric elements is attached between the first metallization and each of the at least four second metallizations, wherein (a) the plurality of thermoelectric elements are arranged such that the first metallization is directly electrically connected to an adjacent first metallization by at least two thermoelectric element pairs, (b) each thermoelectric element of the at least two thermoelectric element pairs is directly attached to the first metallization or the adjacent first metallization, and (c) the first metallization and the adjacent first metallization are positioned next to each other in an electrical pathway that connects the array of first metallizations.

11. The thermoelectric device of claim 10, wherein the at least two thermoelectric element pairs include two n-type thermoelectric elements attached to the first metallization and two p-type thermoelectric elements attached to the adjacent first metallization.

12. The thermoelectric device of claim 10, wherein the at least two thermoelectric element pairs include a first thermoelectric element pair attached to one second metallization of the at least four second metallizations and a second thermoelectric element pair attached to another second metallization of the at least four second metallizations.

13. The thermoelectric device of claim 10, wherein each of the first metallizations and the second metallizations has a quadrilateral shape.

14. The thermoelectric device of claim 10, wherein the plurality of thermoelectric elements are interconnected together through the array of first metallizations and the array of second metallizations to form one of a square shaped network pattern or a delta shaped network pattern.

15. A thermoelectric device, comprising:
a first insulating substrate having a first side, and a second insulating substrate having a second side, the first and the second substrates being positioned such that the first side of the first substrate faces the second side of the second substrate;
an array of electrically conductive first metallizations on the first side of the first substrate, and an array of electrically conductive second metallizations on the second side of the second substrate; and
a plurality of thermoelectric elements, including multiple n-type thermoelectric elements and multiple p-type thermoelectric elements positioned between the first side of the first substrate and the second side of the second substrate such that (a) a first metallization of the array of first metallizations is directly electrically connected to an adjacent first metallization by at least two thermoelectric element pairs, (b) the first metallization and the adjacent first metallization are positioned next to each other in an electrical pathway that connects the array of first metallizations and wherein each thermoelectric element of the at least two thermoelectric element pairs is directly attached to the first metallization or the adjacent first metallization.

16. The thermoelectric device of claim 15, wherein the first substrate and the second substrate are aligned such that each of at least four second metallizations includes a region that overlaps with the first metallization, wherein a separate thermoelectric element of the at least two thermoelectric element pairs is attached between the first metallization and each of the at least four second metallizations.

17. The thermoelectric device of claim 15, wherein the plurality of thermoelectric elements are arranged such that at least two thermoelectric element pairs are formed between each first metallization and an adjacent first metallization.

18. The thermoelectric device of claim 15, wherein the plurality of thermoelectric elements are arranged such that at least two electrical pathways are formed between each first metallization and an adjacent first metallization.

19. The thermoelectric device of claim 15, wherein each of the first metallizations and the second metallizations has a quadrilateral shape.

* * * * *